United States Patent
Gehin

(10) Patent No.: US 9,322,263 B2
(45) Date of Patent: Apr. 26, 2016

(54) SYSTEMS AND METHODS FOR DYNAMIC VISUALIZATION OF FLUID VELOCITY IN SUBSURFACE RESERVOIRS

(71) Applicant: Landmark Graphics Corporation, Houston, TX (US)

(72) Inventor: Maurice Christopher Gehin, Houston, TX (US)

(73) Assignee: Landmark Graphics Corporation, Houston, TX (US)

( * ) Notice: Subject to any disclaimer, the term of this patent is extended or adjusted under 35 U.S.C. 154(b) by 343 days.

(21) Appl. No.: 13/753,420

(22) Filed: Jan. 29, 2013

(65) Prior Publication Data

US 2014/0214386 A1  Jul. 31, 2014

(51) Int. Cl.
*G06F 17/50* (2006.01)
*E21B 47/10* (2012.01)

(52) U.S. Cl.
CPC ............. *E21B 47/10* (2013.01); *G06F 17/5009* (2013.01)

(58) Field of Classification Search
USPC .................................. 703/2, 9, 10; 702/49, 50
See application file for complete search history.

(56) References Cited

U.S. PATENT DOCUMENTS

| | | | |
|---|---|---|---|
| 6,266,071 B1 | 7/2001 | Stam et al. | |
| 7,164,990 B2 | 1/2007 | Bratvedt et al. | |
| 7,369,973 B2 | 5/2008 | Kennon et al. | |
| 7,617,083 B2 | 11/2009 | Bennis et al. | |
| 8,271,247 B2 | 9/2012 | Davidson | |
| 8,280,709 B2 | 10/2012 | Koutsabeloulis et al. | |
| 8,301,426 B2 | 10/2012 | Abasov et al. | |
| 8,301,429 B2 | 10/2012 | Hajibeygi et al. | |
| 9,051,825 B2* | 6/2015 | Khataniar | E21B 43/00 1/1 |
| 2005/0165555 A1 | 7/2005 | Jackson | |
| 2008/0047833 A1* | 2/2008 | Hirahara | G01N 33/49 204/450 |
| 2009/0107230 A1* | 4/2009 | Okcay et al. | 73/148 |
| 2009/0150097 A1 | 6/2009 | Camilleri | |
| 2009/0182541 A1 | 7/2009 | Crick et al. | |
| 2009/0234595 A1* | 9/2009 | Okcay et al. | 702/49 |
| 2010/0081184 A1* | 4/2010 | Downey | E21B 43/006 435/167 |
| 2011/0082676 A1 | 4/2011 | Bratvedt et al. | |
| 2011/0313745 A1 | 12/2011 | Mezghani et al. | |
| 2012/0059634 A1 | 3/2012 | Bouzarkouna et al. | |
| 2012/0191432 A1* | 7/2012 | Khataniar et al. | 703/10 |

(Continued)

FOREIGN PATENT DOCUMENTS

| | | |
|---|---|---|
| WO | 2009155274 A1 | 12/2009 |
| WO | 2012015521 A1 | 2/2012 |

(Continued)

OTHER PUBLICATIONS

Seong Woo Kim; International Search Report & Written Opinion; PCT/US2014/13669; May 20, 2014; 11 pgs; ISA/KR; Korea.

(Continued)

*Primary Examiner* — Thai Phan
(74) *Attorney, Agent, or Firm* — Crain, Caton & James; John Wustenberg

(57) ABSTRACT

Systems and methods for dynamically visualizing fluid velocity in subsurface reservoirs by displaying a particle at different locations on a streamline that represents a fluid path and a fluid velocity in the subsurface reservoir. The systems and methods may be used to display the actual fluid velocity or a proportionate fluid velocity for a respective streamline at predetermined incremental time steps.

20 Claims, 3 Drawing Sheets

(56) References Cited

U.S. PATENT DOCUMENTS

2012/0253770 A1 10/2012 Stern et al.
2013/0051640 A1* 2/2013 Yu et al. .................. 382/128

FOREIGN PATENT DOCUMENTS

WO 2012033560 A1 3/2012
WO 2012091775 A1 7/2012

OTHER PUBLICATIONS

Thai Phan; International Preliminary Report on Patentability; PCT/US14/13669; Feb. 4, 2015; 15 pgs.; IPEA/US, Alexandria, Virginia.
Jacinthe Moreau; Examiner's Letter for Canadian Patent Application No. 2895798; Jul. 23, 2015; 3 pgs.; Canadian Patent Office.
Michael Bottinger, et al.; Tutorial—Interactive 3D Visualization in Earth System Research with Avizo Green 8.0; Version 1.8; Oct. 22, 2013; pp. 84-86; KlimaCampus; Hamburg, Germany.
Display options.png: online documentation explaining all the visualization display options of the streamlines in Nexus and VIP Studio Halliburton software; Jan. 2005; 1 Pg.
StreamCalcNView.png: screenshot of the streamline visualization in Nexus and VIP Studio Halliburton software; Jan. 2005; 1 Pg.
J.M. Ragas, "Interactive visualization of flowfields in an Immersive Virtual Environment" Master's thesis, University of Amsterdam and Section Computational Science, Aug. 2002, p. 65.
Hanson, A.J. and Ma, H., "Quaternion frame approach to streamline visualization" Visualization and Computer Graphics, IEEE Transactions on, vol. 1, No. 2, 1995, pp. 164-174.
Obeysekare et al., "Virtual workbench-a non-immersive virtual environment for visualizing and interacting with 3D objects for scientific visualization" Visualization'96. Proceedings. 1996, pp. 345-349.
Zockler, M. and Stalling, D. And Hege, H.C., "Interactive visualization of 3D-vector fields using illuminated stream lines" Visualization'96. Proceedings., 1996, pp. 107-113.

* cited by examiner

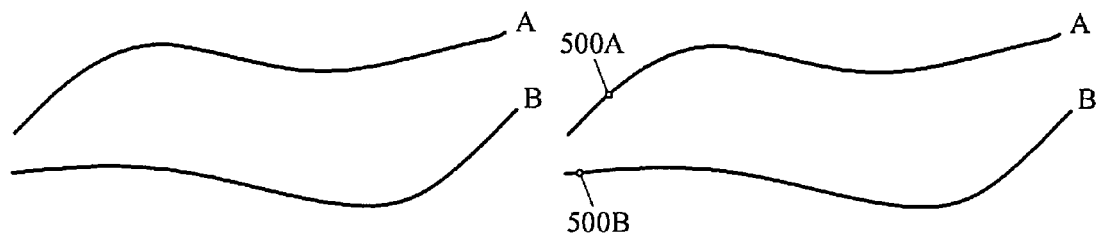
FIG. 3
FIG. 5
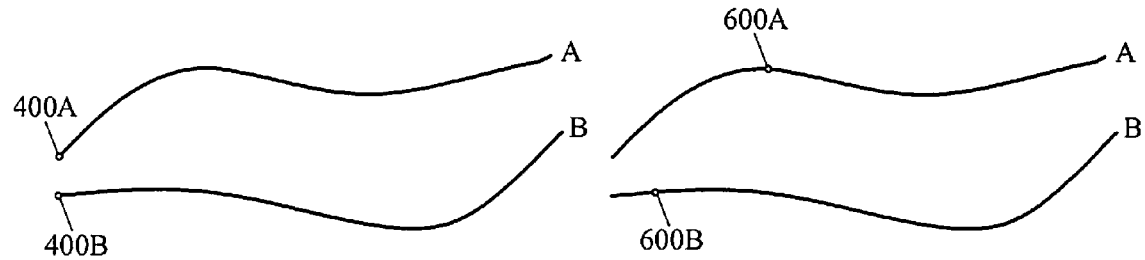
FIG. 4
FIG. 6
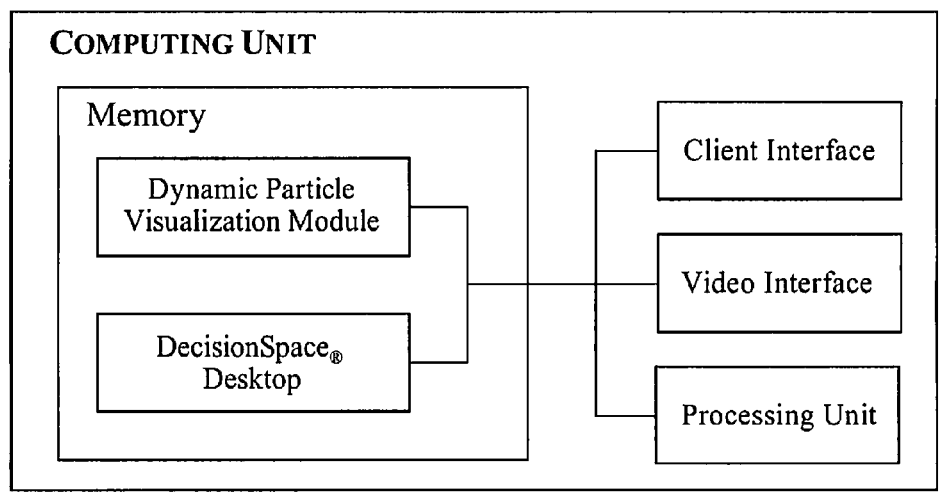
FIG. 7

SYSTEMS AND METHODS FOR DYNAMIC VISUALIZATION OF FLUID VELOCITY IN SUBSURFACE RESERVOIRS

CROSS-REFERENCE TO RELATED APPLICATIONS

Not applicable

STATEMENT REGARDING FEDERALLY SPONSORED RESEARCH

Not applicable.

FIELD OF THE INVENTION

The present invention generally relates to systems and methods for dynamically visualizing fluid velocity in subsurface reservoirs. More particularly, the invention relates to dynamically visualizing fluid velocity in subsurface reservoirs by displaying a particle at different locations on a streamline that represents a fluid path and a fluid velocity in the subsurface reservoir.

BACKGROUND OF THE INVENTION

In the field of oil and gas production, a subsurface hydrocarbon reservoir is exploited when one or more well bores are drilled into the reservoir and liquid hydrocarbons (e.g. oil and gas) are extracted from the reservoir through the well bores. In this event, the well bore is generally referred to as a production well or a production source. A fluid, typically water, may be introduced into the reservoir at one or more points away from the production well to displace liquid or gaseous hydrocarbons, which causes them to be expelled from the reservoir through the production well. The point at which water is introduced into the reservoir is generally referred to as an injection well or injection source.

The expulsion of liquid and/or gaseous hydrocarbons at the production well and the injection of water at the injection well establish a fluid flow pattern in the reservoir, which may be influenced by gravity. The fluid flow within the reservoir may be modeled as a function of time in order to predict how the production of liquid and/or gaseous hydrocarbons from a particular production well will vary over the lifetime of the reservoir.

A mathematical model of the fluid flow in a given reservoir may be constructed by using techniques well known in the art. These techniques, however, are not exact and may be implemented using other numerical techniques to arrive at an estimated solution such as, for example, streamline techniques and finite difference techniques.

Conventional streamline techniques are generally used to compute streamlines, also referred to as a streamline model, that represent the fluid path in a subsurface reservoir between one injection source and a production source and the fluid velocity for each respective streamline. In order to visualize the fluid velocity for a given streamline in a subsurface reservoir, streamlines have been color coded based on predetermined time steps. The color coded portion of the streamline therefore, is updated to reflect the fluid velocity. For example, a portion of a streamline may be colored red to illustrate where a particle representing the fluid velocity for the streamline has already traveled and another portion of the streamline may be colored blue to illustrate where the particle has yet to travel.

Other, more advanced, techniques have been developed to visualize fluid flow in subsurface reservoirs. One technique displays streamlines by assigning a property of each streamline to a visual animation such as, for example, fluid velocity that can be assigned color and size codes to show phase components, rate, volume, statistics and many other properties. The fluid velocity along the streamline therefore, may be displayed as marbles, for example, rolling along the streamline at speeds equal to the velocity of the different types of fluid. The marbles, or other objects representing the fluid velocity for the streamline, can be released at regular time intervals and may move along the streamline at a velocity representing the actual fluid velocity or some other assigned property. These techniques, however, can obstruct portions of the streamline in a display and/or may be limited in complex, compact streamline models where the objects representing the fluid velocity must be displayed adjacent to a respective streamline. In this event, the desired visualization of the fluid velocity is limited to the extent the objects cannot be displayed on a respective streamline and may only be displayed outside the complex, compact streamline model.

BRIEF DESCRIPTION OF THE DRAWINGS

The present invention is described below with references to the accompanying drawings in which like elements are referenced with like reference numerals, and in which:

FIG. 3 is a display illustrating two exemplary streamlines A and B.

FIG. 4 is a display of streamlines A and B illustrating the results of the method in FIG. 2.

FIG. 5 is a display of streamlines A and B further illustrating the results of the method in FIG. 2.

FIG. 6 is a display of streamlines A and B further illustrating the results of the method in FIG. 2.

FIG. 7 is a block diagram illustrating one embodiment of a system for implementing the present invention.

DETAILED DESCRIPTION OF THE PREFERRED EMBODIMENTS

Figure 1:
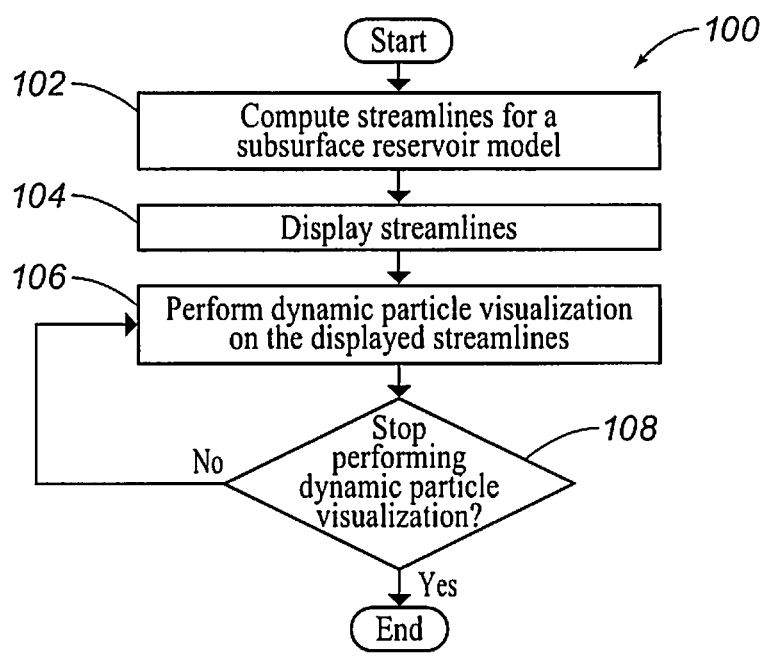
FIG. 1 is a flow diagram illustrating one embodiment of a method for implementing the present invention.

The subject matter of the present invention is described with specificity, however, the description itself is not intended to limit the scope of the invention. The subject matter thus, might also be embodied in other ways, to include different steps or combinations of steps similar to the ones described herein, in conjunction with other technologies. Moreover, although the term "step" may be used herein to describe different elements of methods employed, the term should not be interpreted as implying any particular order among or between various steps herein disclosed unless otherwise expressly limited by the description to a particular order. While the following description refers to the oil and gas industry, the systems and methods of the present invention are not limited thereto and may also be applied in other industries to achieve similar results.

The present invention therefore, overcomes one or more deficiencies in the prior art by providing systems and methods for dynamically visualizing fluid velocity in subsurface reservoirs by displaying a particle at different locations on a streamline that represents a fluid path and a fluid velocity in the subsurface reservoir.

DETAILED DESCRIPTION OF THE PREFERRED EMBODIMENTS

In one embodiment, the present invention includes a method for dynamically visualizing fluid velocity in a subsurface reservoir, which comprises: a) displaying a plurality of streamlines in a streamline model, each streamline representing a fluid path in the subsurface reservoir; b) displaying a particle on each streamline at a simulation start time based on a fluid velocity for a respective streamline; c) removing the particle displayed on each streamline at the simulation start time or at another simulation time; d) displaying another particle on each streamline at another simulation time based on the fluid velocity for a respective streamline, wherein each another simulation time is a sum of a time step, multiplied by a number of times step d) is performed, and the simulation start time; and e) repeating steps c) and d) for each another simulation time that is less than a simulation end time using a computer processor.

In another embodiment, the present invention includes a non-transitory program earner device tangibly carrying computer-executable instructions for dynamically visualizing fluid velocity in a subsurface reservoir, the instructions being executable to implement: a) displaying a plurality of streamlines in a streamline model, each streamline representing a fluid path in the subsurface reservoir; b) displaying a particle on each streamline at a simulation start time based on a fluid velocity for a respective streamline; c) removing the particle displayed on each streamline at the simulation start time or at another simulation time; d) displaying another particle on each streamline at another simulation time based on the fluid velocity for a respective streamline, wherein each another simulation time is a sum of a time step, multiplied by a number of times step d) is performed, and the simulation start time; and e) repeating steps c) and d) for each another simulation time that is less than a simulation end time.

Method Description

Referring now to FIG. 1, a flow diagram of one embodiment of a method 100 for implementing the present invention is illustrated. The method 100 may be used to display the fluid path and the actual fluid velocity or a proportionate fluid velocity for a respective streamline at predetermined incremental time steps.

In step 102, streamlines are computed for a subsurface reservoir model using simulation techniques well known in the art. The streamlines represent a streamline model between one or more injection sources and one or more production sources. The fluid velocity for each streamline is represented by a particle whose coordinates are stored in space at predetermined intervals of time between two predetermined times represented by the time when the simulation starts ($T_0$) and the time when the simulation ends ($T_1$). The fluid path of each particle is represented by a respective streamline.

In step 104, the streamlines are displayed using the client interface and/or the video interface described further in the reference to FIG. 7.

In step 106, dynamic particle visualization is performed on the displayed streamlines. One embodiment of a method for implementing this step is further described in reference to FIG. 2.

In step 108, the method 100 determines whether to stop performing dynamic particle visualization based on input from the client interface and/or the video interface described further in reference to FIG. 7. If dynamic particle visualization should stop performing, then the method 100 ends. If dynamic particle visualization should not stop performing, then the method 100 returns to step 106.

Figure 2:
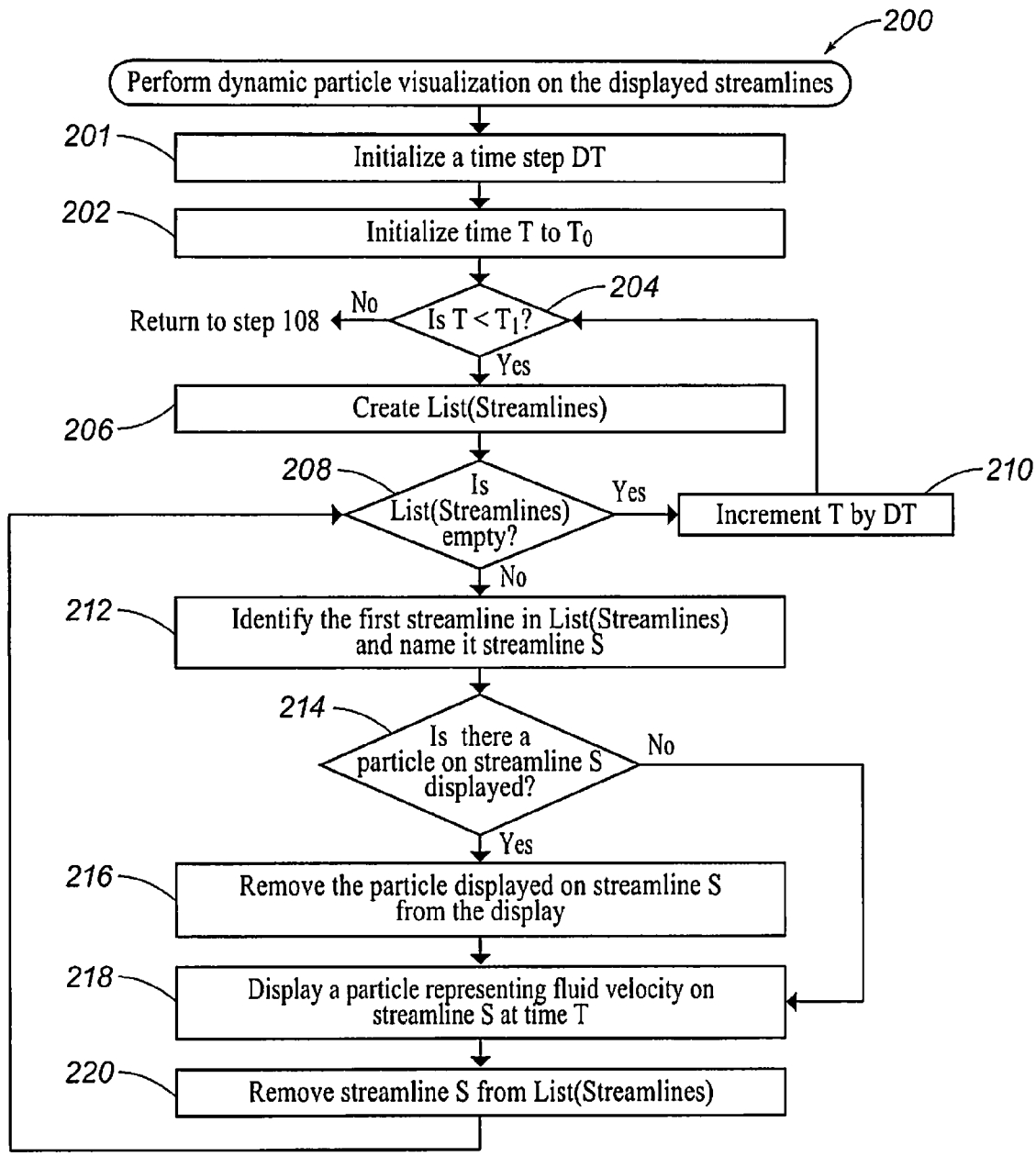
FIG. 2 is a flow diagram illustrating one embodiment of a method for implementing step 106 in FIG. 1.

Referring now to FIG. 2, one embodiment of a method 200 for implementing step 106 in FIG. 1 is illustrated.

In step 201, a time step DT is initialized. The time step DT may be initialized to a predetermined time step DT using the client interface and/or the video interface described further in reference to FIG. 7 or a default time step DT. In either case, the time step DT represents equal increments between $T_0$ and $T_1$, which is some fraction of $T_1-T_0$. The time step DT may be optimally computed using the fluid velocity for each streamline and the number of pixels needed to display each streamline in order to achieve a continuous, uninterrupted, particle visualization between $T_0$ and $T_1$ that represents the actual fluid velocity or a proportionate fluid velocity for the streamline.

In step 202, time T is initialized to $T_0$, which represents the simulation start time.

In step 204, the method 200 determines if T is less than $T_1$. If T is not less than $T_1$, then the method 200 returns to step 108. If T is less than $T_1$, then the method 200 proceeds to step 206.

In step 206, List(Streamlines) is created for storing the streamlines computed in steps 102 of FIG. 1.

In step 208, the method 200 determines if List(Streamlines) is empty. If List(Streamlines) is not empty, then the method 200 proceeds to step 212. If List(Streamlines) is empty, then the method 200 proceeds to step 210.

In step 210, T is incremented by DT and the method 200 returns to step 204. T may be incremented by adding T and DT.

In step 212, the first streamline in List(Streamlines) is identified and named streamline S.

In step 214, the method 200 determines if there is particle on streamline S displayed. If there is not a particle on streamline S displayed, then the method 200 proceeds to step 218. If there is particle on streamline S displayed, then the method 200 proceeds to step 216.

In step 216, the particle displayed on streamline S is removed from the display.

In step 218, a particle representing fluid velocity is displayed on streamline S at time T based on the fluid velocity for streamline S. Because the location of the particle displayed on streamline S at time T is based on the fluid velocity for streamline S, particles displayed on other streamlines at time T may be displayed at different locations if the fluid velocity for each streamline is different than the fluid velocity for streamline S. The particle is no larger than a pixel needed to display the streamline S and may be displayed as a white pixel, resembling light on the streamline S, or any other color differentiating the particle from the other pixels needed to display the streamline S.

In step 220, streamline S is removed from List(Streamlines) and the method 200 returns to step 208.

While the method 200 is performed on a streamline by streamline basis, the results of the method 200 may be displayed for all streamlines in the List(Streamlines) at the same time i) after each List(Streamlines) is emptied using cached results or ii) as each List(Streamlines) is emptied using commercially available graphics accelerators. Alternatively, the method 200 may be modified to perform the dynamic particle visualization on the displayed streamlines in each List (Streamlines) at the same time.

Referring now to FIG. 3, a display of two exemplary streamlines is illustrated wherein the fluid velocity for streamline A is approximately three times faster than the fluid velocity for streamline B.

In FIG. 4, a display of streamlines A and B illustrates the results for the first List(Streamlines) according to the method 200. A particle 400A, representing fluid velocity for streamline A, is illustrated at time $T_0$ and a particle 400B, representing fluid velocity for streamline B, is illustrated at time $T_0$. Each particle is displayed on a respective streamline from $T_0$ to $T_1$ which represents the direction of the fluid flowing along the fluid path.

In FIG. 5, a display of streamlines A and B illustrates the results for the second List(Streamlines) according to the method 200. Particle 400A is removed from the display and particle 500A, representing fluid velocity for streamline A, is displayed at time $T_0$+DT. Likewise, particle 400B is removed from the display and particle 500B, representing fluid velocity for streamline B, is displayed at time $T_0$+DT. The fluid velocity for streamline A represented by particle 500A is approximately three times faster than the fluid velocity for streamline B represented by particle 500B. The fluid velocity may be the actual fluid velocity for each respective streamline or it may be proportional to the actual fluid velocity for each respective streamline.

In FIG. 6, a display of streamlines A and B illustrates the results for the third List(Streamlines) according to the method 200. Particles 500A and 500B are removed from the display and particles 600A and 600B, representing fluid velocity for streamlines A and B, respectively, are displayed at time $T_0$+2 (DT). The difference in fluid velocity between streamlines A and B becomes more apparent and visual with each emptied List(Streamlines) as illustrated by the difference in location between particle 600A and particle 600B.

The present invention therefore, improves visualization of fluid velocity for each streamline without the need of a color chart or a spreadsheet because fluid velocity is represented by the display of a particle at different locations at different respective times on a streamline. Moreover, the displayed particles on each respective streamline do not obstruct the display of the streamlines—particularly in a complex, compact streamline model.

System Description

The present invention may be implemented through a computer-executable program of instructions, such as program modules, generally referred to software applications or application programs executed by a computer. The software may include, for example, routines, programs, objects, components and data structures that perform particular tasks or implement particular abstract data types. The software forms an interface to allow a computer to react according to a source of input. DecisionSpace® Desktop, which is a commercial software application marketed by Landmark Graphics Corporation, may be used as an interface application to implement the present invention. The software may also cooperate with other code segments to initiate a variety of tasks in response to data received in conjunction with the source of the received data. Other code segments may provide optimization components including, but not limited to, neural networks, earth modeling, history matching, optimization, visualization, data management, reservoir simulation and economics. The software may be stored and/or carried on any variety of memory such as CD-ROM, magnetic disk, bubble memory and semiconductor memory (e.g., various types of RAM or ROM). Furthermore, the software and its results may be transmitted over a variety of carrier media such as optical fiber, metallic wire, and/or through any of a variety of networks, such as the Internet.

Moreover, those skilled in the art will appreciate that the invention may be practiced with a variety of computer-system configurations, including hand-held devices, multiprocessor systems, microprocessor-based or programmable-consumer electronics, minicomputers, mainframe computers, and the like. Any number of computer-systems and computer networks are acceptable for use with the present invention. The invention may be practiced in distributed-computing environments where tasks are performed by remote-processing devices that are linked through a communications network. In a distributed-computing environment, program modules may be located in both local and remote computer-storage media including memory storage devices. The present invention may therefore, be implemented in connection with various hardware, software or a combination thereof, in a computer system or other processing system.

Referring now to FIG. 7, a block diagram illustrates one embodiment of a system for implementing the present invention on a computer. The system includes a computing unit, sometimes referred to as a computing system, which contains memory, application programs, a client interface, a video interface, and a processing unit. The computing unit is only one example of a suitable computing environment and is not intended to suggest any limitation as to the scope of use or functionality of the invention.

The memory primarily stores the application programs, which may also be described as program modules containing computer-executable instructions, executed by the computing unit for implementing the present invention described herein and illustrated in FIGS. 1-2. The memory therefore, includes a dynamic particle visualization module, which enables the methods illustrated and described in reference to FIGS. 1-2 and integrates functionality from the remaining application programs illustrated in FIG. 7. In particular, the dynamic particle visualization module may be used to perform step 106 in FIG. 1. The memory also includes DecisionSpace® Desktop, which may be used as an interface application to perform steps 102, 104 and 108 in FIG. 1. Although DecisionSpace® Desktop may be used as an interface application, other interface applications may be used, instead, or the dynamic particle visualization module may be used as a stand-alone application.

Although the computing unit is shown as having a generalized memory, the computing unit typically includes a variety of computer readable media. By way of example, and not limitation, computer readable media may comprise computer storage media and communication media. The computing system memory may include computer storage media in the form of volatile and/or nonvolatile memory such as a read only memory (ROM) and random access memory (RAM). A basic input/output system (BIOS), containing the basic routines that help to transfer information between elements within the computing unit, such as during start-up, is typically stored in ROM. The RAM typically contains data and/or program modules that are immediately accessible to, and/or presently being operated on, the processing unit. By way of example, and not limitation, the computing unit includes an operating system, application programs, other program modules, and program data.

The components shown in the memory may also be included in other removable/nonremovable, volatile/nonvolatile computer storage media or they may be implemented in the computing unit through an application program interface ("API") or cloud computing, which may reside on a separate computing unit connected through a computer system or network. For example only, a hard disk drive may read from or write to nonremovable, nonvolatile magnetic media, a magnetic disk drive may read from or write to a removable, nonvolatile magnetic disk, and an optical disk drive may read from or write to a removable, nonvolatile optical disk such as a CD ROM or other optical media. Other removable/non-removable, volatile/nonvolatile computer storage media that can be used in the exemplary operating environment may include, but are not limited to, magnetic tape cassettes, flash memory cards, digital versatile disks, digital video tape, solid state RAM, solid state ROM, and the like. The drives and their associated computer storage media discussed above provide storage of computer readable instructions, data structures, program modules and other data for the computing unit.

A client may enter commands and information into the computing unit through the client interface, which may be input devices such as a keyboard and pointing device, commonly referred to as a mouse, trackball or touch pad. Input devices may include a microphone, joystick, satellite dish, scanner, or the like. These and other input devices are often connected to the processing unit through the client interface that is coupled to a system bus, but may be connected by other interface and bus structures, such as a parallel port or a universal serial bus (USB).

A monitor or other type of display device may be connected to the system bus via an interface, such as a video interface. A graphical user interface ("GUI") may also be used with the video interface to receive instructions from the client interface and transmit instructions to the processing unit. In addition to the monitor, computers may also include other peripheral output devices such as speakers and printer, which may be connected through an output peripheral interface.

Although many other internal components of the computing unit are not shown, those of ordinary skill in the art will appreciate that such components and their interconnection are well-known.

While the present invention has been described in connection with presently preferred embodiments, it will be understood by those skilled in the art that it is not intended to limit the invention to those embodiments. It is therefore, contemplated that various alternative embodiments and modifications may be made to the disclosed embodiments without departing from the spirit and scope of the invention defined by the appended claims and equivalents thereof.

The invention claimed is:

1. A method for dynamically visualizing fluid velocity in a subsurface reservoir, which comprises:
   a) displaying a plurality of streamlines in a streamline model, each streamline representing a fluid path in the subsurface reservoir;
   b) displaying a particle on each streamline at a simulation start time based on a fluid velocity for a respective streamline;
   c) removing the particle displayed on each streamline at the simulation start time or at another simulation time;
   d) displaying another particle on each streamline at another simulation time based on the fluid velocity for a respective streamline, wherein each another simulation time is a sum of a time step, multiplied by a number of times step d) is performed, and the simulation start time; and
   e) repeating steps c) and d) for each another simulation time that is less than a simulation end time using a computer processor.

2. The method of claim 1, further comprising repeating steps b) through e).

3. The method of claim 1, wherein each particle represents the fluid velocity for a respective streamline.

4. The method of claim 1, wherein each particle displayed on each streamline is no larger than a pixel needed to display a respective streamline.

5. The method of claim 1, wherein the time step is a predetermined time step or a default time step that represents equal increments between the simulation start time and the simulation end time.

6. The method of claim 1, wherein the time step is based on the fluid velocity for each streamline and a number of pixels needed to display each streamline.

7. The method of claim 1, wherein the display of each particle on each streamline visualizes an actual fluid velocity or a proportionate fluid velocity for a respective streamline.

8. The method of claim 1, wherein a majority of a number of pixels needed to display a respective streamline are used to display each particle on the respective streamline.

9. The method of claim 8, wherein each particle displayed on a respective streamline is displayed as one of the number of pixels needed to display the respective streamline.

10. The method of claim 9, wherein each pixel used to display a respective particle on a respective streamline is displayed in a color that is different than a color of a remaining number of pixels needed to display the respective streamline.

11. A non-transitory program carrier device tangibly carrying computer-executable instructions for dynamically visualizing fluid velocity in a subsurface reservoir, the instructions being executable to implement:
    a) displaying a plurality of streamlines in a streamline model, each streamline representing a fluid path in the subsurface reservoir;
    b) displaying a particle on each streamline at a simulation start time based on a fluid velocity for a respective streamline;
    c) removing the particle displayed on each streamline at the simulation start time or at another simulation time;
    d) displaying another particle on each streamline at another simulation time based on the fluid velocity for a respective streamline, wherein each another simulation time is a sum of a time step, multiplied by a number of times step d) is performed, and the simulation start time; and
    e) repeating steps c) and d) for each another simulation time that is less than a simulation end time.

12. The program carrier device of claim 11, further comprising repeating steps b) through e).

13. The program carrier device of claim 11, wherein each particle represents the fluid velocity for a respective streamline.

14. The program carrier device of claim 11, wherein each particle displayed on each streamline is no larger than a pixel needed to display a respective streamline.

15. The program carrier device of claim 11, wherein the time step is a predetermined time step or a default time step that represents equal increments between the simulation start time and the simulation end time.

16. The program carrier device of claim 11, wherein the time step is based on the fluid velocity for each streamline and a number of pixels needed to display each streamline.

17. The program carrier device of claim 11, wherein the display of each particle on each streamline visualizes an actual fluid velocity or a proportionate fluid velocity for a respective streamline.

18. The program carrier device of claim 11, wherein a majority of a number of pixels needed to display a respective streamline are used to display each particle on the respective streamline.

19. The program carrier device of claim 18, wherein each particle displayed on a respective streamline is displayed as one of the number of pixels needed to display the respective streamline.

20. The program carrier device of claim 19, wherein each pixel used to display a respective particle on a respective streamline is displayed in a color that is different than a color of a remaining number of pixels needed to display the respective streamline.

\* \* \* \* \*